United States Patent
Bakker

(10) Patent No.: US 7,382,436 B2
(45) Date of Patent: Jun. 3, 2008

(54) MIRROR, LITHOGRAPHIC APPARATUS, DEVICE MANUFACTURING METHOD, AND DEVICE MANUFACTURED THEREBY

(75) Inventor: Levinus Pieter Bakker, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 54 days.

(21) Appl. No.: 10/887,306

(22) Filed: Jul. 9, 2004

(65) Prior Publication Data

US 2005/0024614 A1 Feb. 3, 2005

(30) Foreign Application Priority Data

Jul. 9, 2003 (EP) ................... 03077155

(51) Int. Cl.
G03B 27/54 (2006.01)
G03B 27/42 (2006.01)
G02B 17/00 (2006.01)

(52) U.S. Cl. ............... 355/67; 355/53; 359/591

(58) Field of Classification Search ........ 355/53, 355/67–71; 359/591, 592
See application file for complete search history.

(56) References Cited

U.S. PATENT DOCUMENTS

| | | | |
|---|---|---|---|
| 3,045,532 A * | 7/1962 | Staunton | ............... 359/571 |
| 3,046,839 A | 7/1962 | Bird et al. | |
| 3,942,873 A | 3/1976 | Shimotakahara | |
| 4,915,463 A * | 4/1990 | Barbee, Jr. | ............... 359/360 |
| 6,118,577 A | 9/2000 | Sweatt et al. | |
| 6,469,827 B1 * | 10/2002 | Sweatt et al. | ............... 359/351 |
| 6,927,915 B2 * | 8/2005 | Nakai | ............... 359/569 |
| 6,995,910 B2 * | 2/2006 | Fabiny et al. | ............... 359/571 |
| 2003/0002622 A1 | 1/2003 | Martynov et al. | |
| 2003/0058529 A1 | 3/2003 | Goldstein | |
| 2003/0081316 A1 * | 5/2003 | Goldberg et al. | ........... 359/558 |

FOREIGN PATENT DOCUMENTS

TW 538256 6/2003
TW 565706 12/2003

OTHER PUBLICATIONS

Translation of Taiwanese Official Action issued for Taiwan Patent Application No. 093120508, dated May 7, 2007.
Ross, S.T. et al., "Fabrication process for multilayer X-ray phase gratings," *Optical Engineering*, 1990, vol. 29 (7): 728-732.

* cited by examiner

*Primary Examiner*—Henry Hung Nguyen
(74) *Attorney, Agent, or Firm*—Pillsbury Winthrop Shaw Pittman LLP

(57) ABSTRACT

A mirror has a mirror surface, wherein the mirror surface includes a protrusion including a material selected from at least one of Be, B, C, P, S, K, Ca, Sc, Br, Rb, Sr, Y, Zr, Nb, Mo, Ba, La, Ce, Pr, Pa and U, or a first protrusion including a first material selected from at least one of Be, B, C, P, S, K, Ca, Sc, Br, Rb, Sr, Y, Zr, Nb, Mo, Ba, La, Ce, Pr, Pa and U, and a second protrusion including a second material selected from at least one of Be, B, C, Si, P, S, K, Ca, Sc, Br, Rb, Sr, Y, Zr, Nb, Mo, Ba, La, Ce, Pr, Pa and U, and the first and second materials are not the same. A lithographic projection apparatus includes such a mirror. A device manufacturing method includes reflecting a beam of radiation by use of such a mirror. A device is manufactured according to the method.

15 Claims, 3 Drawing Sheets

MIRROR, LITHOGRAPHIC APPARATUS, DEVICE MANUFACTURING METHOD, AND DEVICE MANUFACTURED THEREBY

BACKGROUND OF THE INVENTION

This application claims priority from European Patent Application No. 03077155.4, filed Jul. 9, 2003, herein incorporated by reference in its entirety.

1. Field of the Invention

The present invention relates to a mirror having a mirror surface, a lithographic apparatus, a device manufacturing method and a device manufactured thereby.

2. Description of the Related Art

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation, for example of around 13 nm. Such radiation is termed extreme ultraviolet (EUV) or soft x-ray, and possible sources include, for example, laser-produced plasma sources, discharge plasma sources, or synchrotron radiation from electron storage rings.

Some extreme ultraviolet sources, especially plasma sources, emit radiation over a wide range of frequencies, even including infrared (IR), visible (VIS), ultraviolet (UV) and deep ultraviolet. These undesired frequencies will propagate and cause heating problems in the illumination and projection systems and cause undesired exposure of the resist if not blocked. Although the multilayer mirrors of the illumination and projection systems are optimized for reflection of the desired wavelength, for example 13 nm, they are optically flat and have relatively high reflectivities at IR, visible and UV wavelengths. It is therefore desirable to select from the source a relatively narrow band of frequencies for the beam of radiation. Even where the source has a relatively narrow emission line, it is desirable to reject radiation out of that line, especially at longer wavelengths. It has been proposed to use a thin membrane as a filter to perform this function. However, such a film is very delicate and becomes very hot, 200-300° C. or more, leading to high thermal stresses and cracking, sublimation and oxidation in the high power levels used in a lithographic projection apparatus. A membrane filter also generally absorbs at least 50% of the desired radiation.

U.S. Pat. No. 6,678,037, incorporated herein by reference, describes a lithographic projection apparatus wherein a grating spectral filter is used in the radiation system of the lithographic projection apparatus. This grating spectral filter is designed for passing radiation of desired wavelengths to form a beam of radiation and for deflecting radiation of undesired wavelengths. The grating spectral filter is substantially formed of a material having a complex refractive index close to unity at the desired wavelengths and includes silicon protrusions. The protrusions have a laminar sawtooth profile or a laminar square wave profile, as shown in FIGS. 3 and 4 of U.S. Pat. No. 6,678,037, respectively, and are present on a mirror, having a mirror surface.

U.S. Patent Application Publication 2003/0058529 A1 discloses a grating structure on a mirror substrate etched to have a grating period causing diffracting, and a multi-layer coating deposited on the grating structure. Further, U.S. Pat. No. 6,469,827 discloses blazed gratings that include a series of ramps. In an embodiment, the blazed grating is constructed on a substrate before a reflective multilayer, for example alternating Si and Mo layers, is deposited over the grating. A disadvantage is that Si does not block IR radiation very well.

SUMMARY OF THE INVENTION

It is an aspect of the present invention to provide a mirror that can be used as optical filter that may be used in a lithographic projection apparatus to select EUV radiation from a wide band source and/or to reject undesired frequencies and with which, for example, IR radiation is more effectively blocked.

According to the present invention, there is provided a mirror having a mirror surface, wherein the mirror surface includes a first protrusion including a first material, and including a second protrusion including a second material, and the first and second materials are not the same. Such a mirror can be used, for example as a normal incidence mirror or as grazing incidence mirror, to reflect desired wavelengths, and to block undesired wavelengths. This can be used when a laminar protrusion profile is present, and one wants to compensate for a possible difference in optical path lengths of radiation that propagates through a protrusion. Hence, the present invention also includes an embodiment which includes a mirror having a mirror surface including first and second protrusions, wherein the first protrusions and second protrusions are arranged in such a way that for desired radiation an optical path length difference is created that does not vary over the mirror surface. The optical path length difference over the mirror surface is thus zero, or varies only an integer times the wavelength. The laminar protrusion profile may form a grating blazed and/or may be designed for the desired wavelength, and the materials of the protrusions may be transparent or substantially transparent for the desired wavelength.

In another embodiment, a mirror includes a mirror surface, wherein the mirror surface includes a first protrusion including a first material, and includes a second protrusion including a second material, the materials of the first and second protrusions are not the same, the materials are substantially transparent for the desired radiation, and the protrusions are arranged to form a grating. By selecting parameters, including for example the materials (index of refraction), heights and/or shape, distance (period) of the first and second protrusions, and a certain angle of incidence of the projection beam on the mirror, a mirror can be obtained that reflects the desired radiation while correcting by the different materials the optical path length difference of the propagating radiation of the desired wavelength(s), such that it does not vary over the mirror surface. In yet another embodiment this grating is a blazed grating.

In a still further embodiment, a mirror includes a mirror surface, wherein the mirror surface includes a first protrusion including a first material selected from at least one of Be, B, C, P, S, K, Ca, Sc, Br, Rb, Sr, Y, Zr, Nb, Mo, Ba, La, Ce, Pr, Pa and U, and a second protrusion including a second material selected from at least one of Be, B, C, Si, P, S, K, Ca, Sc, Br, Rb, Sr, Y, Zr, Nb, Mo, Ba, La, Ce, Pr, Pa and U, and the first and second materials are not the same. Such mirror provides for selection of the desired EUV wavelengths from a beam of radiation, and deflecting or absorbing radiation of undesired wavelengths, for example UV, visible or IR.

The first and second materials are, according to one embodiment, substantially transparent for EUV radiation of, for example, about 13.5 nm. The materials can be arranged in different ways, for example as a sawtooth profile, in which the different materials are on top of each other, or in a block profile, in which the materials are arranged next to each other. As mentioned above, the different heights of the materials may be chosen in such a way, that under a certain angle, at every position the sum of the phase shifts which are induced by the different materials is the same, or substantially the same), for the radiation that has to be transmitted. Hence, the present invention also includes an embodiment including a mirror having a mirror surface including first and second protrusions, wherein the first protrusion and second protrusion are arranged in such a way that for EUV radiation an optical path length difference is created that does not vary over the mirror surface.

In another embodiment, the materials are selected from at least one of Si, Be and Zr. In still another embodiment, the material of the first protrusion or the material of the second protrusion is selected from at least one of Si, Be and Zr. In yet another embodiment of the present invention, the materials of the first and second protrusion have a relatively large difference in refractive index, for example Mo and Si.

In an embodiment, a mirror includes a mirror surface, wherein the mirror surface includes a first protrusion including a first material selected from at least one of Be, B, C, P, S, K, Ca, Sc, Br, Rb, Sr, Y, Zr, Nb, Mo, Ba, La, Ce, Pr, Pa and U, and a second protrusions including a second material selected from at least one of Be, B, C, Si, P, S, K, Ca, Sc, Br, Rb, Sr, Y, Zr, Nb, Mo, Ba, La, Ce, Pr, Pa and U, the first and second materials are not the same, the protrusions include different materials, the protrusions have either: a saw tooth profile, wherein a first and a second protrusion are arranged such that they form together one protrusion with a certain period, or b) a square wave profile, wherein a first and a second protrusion are arranged next to each other, and form together two different protrusions with a certain period. Under a certain angle of a beam of radiation, at every position the sum of the phase shifts which are induced by the different materials is the same, or substantially the same, for the radiation that has to be transmitted. Hence, the first and second protrusions are arranged in such a way that for EUV radiation an optical path length difference is created that does not vary over the mirror surface.

In yet another embodiment, a mirror includes a mirror surface, wherein the mirror surface includes a first protrusion including a first material selected from at least one of Be, B, C, P, S, K, Ca, Sc, Br, Rb, Sr, Y, Zr, Nb, Mo, Ba, La, Ce, Pr, Pa and U, and a second protrusion including a second material selected from at least one of Be, B, C, Si, P, S, K, Ca, Sc, Br, Rb, Sr, Y, Zr, Nb, Mo, Ba, La, Ce, Pr, Pa and U, the first and second materials are not the same, the first and second protrusions have a period, and within the period, there is a difference in material composition, for example a gradient, such that under a certain angle of a beam of radiation, at every position the sum of the phase shifts which are induced by the different materials is the same, or substantially the same, for the radiation that has to be transmitted. Hence, the first and second protrusions are arranged in such a way that for EUV radiation an optical path length difference is created that does not vary over the mirror surface.

In another embodiment, a mirror includes a mirror surface including protrusions, wherein the protrusions are arranged in such a way that when a beam of radiation is radiated on the mirror, desired wavelengths of the beam of radiation are passed and undesired wavelengths are deflected in other directions and/or absorbed. In another embodiment, the invention is directed to a mirror, wherein the protrusions are arranged in such a way that when a beam of radiation is incident on the mirror, desired wavelengths of the beam of radiation are passed in a predetermined direction and undesired wavelengths are deflected in other directions and/or absorbed.

In a further aspect of the invention, a lithographic projection apparatus includes a radiation system configured to supply a beam of radiation; a support configured to support a patterning device, the patterning device configured to pattern the beam of radiation according to a desired pattern; a substrate table configured to hold a substrate; a projection system configured to project the patterned beam onto a target portion of the substrate; and a mirror having a mirror surface, wherein the mirror surface includes a first protrusion including a first material selected from at least one of Be, B, C, P, S, K, Ca, Sc, Br, Rb, Sr, Y, Zr, Nb, Mo, Ba, La, Ce, Pr, Pa and U, and including a second protrusion including a second material selected from at least one of Be, B, C, Si, P, S, K, Ca, Sc, Br, Rb, Sr, Y, Zr, Nb, Mo, Ba, La, Ce, Pr, Pa and U, and the first and second materials are not the same. A lithographic apparatus including such mirror can block more radiation having undesired wavelengths or a broader spectrum of radiation having undesired wavelengths this mirror.

In an embodiment, a mirror is arranged close to the radiation system, for example on the surface of a radiation collector, or on a grazing incidence mirror, or on a multilayer mirror, which are positioned after the radiation source.

The present invention also includes a method wherein a mirror according to the present invention is used. In an embodiment, a mirror is provided in such a way in a beam of radiation, for example EUV radiation, having an angle of incidence between 0 and 90°, that part of the radiation only passes one first and one second protrusion. In another embodiment, the first protrusions and second protrusions are arranged in such a way that for EUV radiation an optical path length difference is created that does not vary over the mirror surface. The optical path length differences of the desired radiation within the projection beam is zero or an integer times the wavelength. In yet a further embodiment, the protrusions are arranged in such a way that a part of EUV radiation of a beam of radiation including EUV radiation, having an angle of incidence between 60° and 90°, that part of the EUV radiation only passes one first and one second protrusion. An appropriate angle is, for example, between about 75 to 85° for a grazing incidence (GI) mirror.

According to another aspect of the present invention, a mirror includes a mirror surface, wherein the mirror surface includes a protrusion including a material selected from at least one of Be, B, C, P, S, K, Ca, Sc, Br, Rb, Sr, Y, Zr, Nb, Mo, Ba, La, Ce, Pr, Pa and U.

In a further aspect of the present invention, there is provided a lithographic projection apparatus including a radiation system configured to supply a beam of radiation; a support configured to support a patterning device, the patterning device configured to pattern the beam of radiation according to a desired pattern; a substrate table configured to hold a substrate; a projection system configured to project the patterned beam onto a target portion of the substrate; and a mirror, the mirror having a mirror surface that includes a protrusion including a material selected from at least one of Be, B, C, P, S, K, Ca, Sc, Br, Rb, Sr, Y, Zr, Nb, Mo, Ba, La, Ce, Pr, Pa and U. Combinations of materials can also be chosen, and also other materials, that are transmissive for EUV radiation, can be chosen.

The use of a mirror or such an apparatus permits EUV radiation to be reflected by the mirror under a certain angle. Only the desired EUV radiation is reflected in this angle, whereas undesired radiation, for example IR radiation, is absorbed or substantially absorbed by the above mentioned materials and/or is deflected or refracted in other directions.

In an embodiment of the present invention, the mirror has a mirror surface with protrusions, wherein the protrusions are arranged in a regular pattern. This can, for example, be a mirror surface wherein the protrusions are arranged to form a (blazed) grating, for example a one dimensional grating, for example laminar arranged lines or sawtooth profile, or a two dimensional grating, for example regular arranged cubes. Hence, the present invention also includes a mirror having a mirror surface wherein the protrusions are arranged to form a (blazed) grating profile.

In a further embodiment, the present invention includes a mirror having a mirror surface wherein the mirror is a grazing incidence mirror, or wherein the mirror is a multilayer mirror, for example as described in U.S. Pat. No. 6,678,037.

In an embodiment of the present invention, the protrusions are arranged in such a way that a part of EUV radiation of a beam of radiation including EUV radiation, having an angle of incidence between 0° and 90°, only passes one protrusion. This leads to a minimum of loss of the desired radiation, whereas the radiation with wavelengths that are less desired is substantially blocked by the absorption, refraction or deflection of this radiation by the protrusions. A characteristic angle may be between about 75 to 85° for a grazing incidence (GI) mirror. The angle of incidence is measured with respect to the normal of the mirror surface. In yet a further embodiment, the protrusions are arranged in such a way that a part of EUV radiation of a beam of radiation including EUV radiation, having an angle of incidence between 60° and 90°, that part of the EUV radiation only passes one protrusion.

In a further embodiment, the protrusions are arranged in such a way that a part of EUV radiation of a beam of radiation including EUV radiation, having an angle of incidence between 0° and 90°, only passes one protrusion, and the protrusions, having a length and a period, are arranged in such a way that the length of the protrusions is substantially less than the period of the protrusions. For example, the ratio of the length of a protrusion to the period of the protrusions is equal or smaller than 1:5, for example, or equal or smaller than 1:10, or equal or smaller than 1:20. In this way, possible diffractive losses of the desired radiation at the top surfaces of the protrusions are minimized, and the beam of radiation may pass exactly only one protrusion.

In another embodiment, the present invention includes a lithographic apparatus wherein one or more of the mirrors are arranged close to the radiation system, for example on the surface of a radiation collector, or on a grazing incidence mirror, or on a multilayer mirror, which are positioned after the radiation source.

According to a further aspect of the present invention, there is provided a device manufacturing method including reflecting a beam of radiation by use of one or more mirrors, each mirror having a mirror surface that includes one or more protrusions including a material selected from at least one of Be, B, C, P, S, K, Ca, Sc, Br, Rb, Sr, Y, Zr, Nb, Mo, Ba, La, Ce, Pr, Pa and U.

When radiation is reflected by the mirror, for example under a certain angle, only the desired radiation is reflected in this angle, whereas undesired radiation, for example IR radiation, is absorbed by above mentioned materials and/or is reflected or refracted in other directions. This provides improved results, for example with respect to spatial resolution of the patterned beam on the layer of radiation-sensitive material. Additionally, the materials of which the protrusions are made are not restricted to materials having a real part of the index of refraction for EUV radiation, for example of about 13 nm, close to unity, for example Si for EUV radiation, as is the case for U.S. Pat. No. 6,678,037. U.S. Pat. No. 6,678,037 requires that the protrusions are invisible, i.e. there is no change of index of refraction from vacuum into protrusion and vice versa, and thus, the protrusions should have an index of refraction close to unity.

According to further aspect of the present invention, there is provided a device which is manufactured according to a method of the present invention or with an apparatus according to the invention.

As used throughout the description, "protrusions" are defined as structures extending from the mirror surface that may include a material selected from at least one of Be, B, C, P, S, K, Ca, Sc, Br, Rb, Sr, Y, Zr, Nb, Mo, Ba, La, Ce, Pr, Pa and U. In case the mirror surface includes a first protrusion including a first material selected from at least one of Be, B, C, P, S, K, Ca, Sc, Br, Rb, Sr, Y, Zr, Nb, Mo, Ba, La, Ce, Pr, Pa and U, and a second protrusion including a second material selected from at least one of Be, B, C, Si, P, S, K, Ca, Sc, Br, Rb, Sr, Y, Zr, Nb, Mo, Ba, La, Ce, Pr, Pa and U, "protrusions", which are present on the mirror surface, are defined as structures extending from the mirror surface that may include a material selected from at least one of Be, B, C, Si, P, S, K, Ca, Sc, Br, Rb, Sr, Y, Zr, Nb, Mo, Ba, La, Ce, Pr, Pa and U. These protrusions may be made via lithographic techniques. In such a technique, the upper surface is polished to a very good surface roughness and grooves are etched with the lands defined by a photoresist pattern. In this way, a certain profile is obtained, for example laminar block or laminar sawtooth. The profile may also be provided by ruling, i.e. scratching a line, a layer of a first material with a diamond tool.

The protrusion may include one material, but the protrusion may also include combinations of materials, for example SiC, $B_4C$, etc. The phrase "wherein the first and second materials are not the same", may therefore mean that two protrusions next to each other, for example in the case of a laminar square wave profile, wherein the two protrusions form one period, may include different materials, for example a Mo and Si protrusion, having different heights. The phrase may also mean, for example in the case of a laminar saw tooth profile, two protrusion on top of each other together forming one period, the first protrusion including for example Mo and the second protrusion including for example Si. The phrase may further also mean that the first and second protrusions include different compositions, and thus induce different phase shifts and optical path lengths, for example the first protrusion including Si and the second protrusion including SiC. The phrase may also include first and second protrusions, both including for example Si and Mo layers, but having different layer heights, such that the protrusions are different and include different compositions.

The protrusions may have a laminar sawtooth profile, wherein the protrusions have a sawtooth profile that is laminarly arranged on a mirroring surface. The profile can be arranged to form a (blazed) one dimensional grating, with a certain number of parallel lines, for example laminar sawtooth protrusions. The protrusions may also have a laminar square wave profile, wherein the protrusions have a square or rectangle structure, that is laminarly arranged on a mirroring surface. The profile can be arranged to form a one dimensional grating, with a certain number of parallel lines, for example laminar square wave protrusions.

The protrusions might also be periodically arranged in two directions. For example, the protrusions may have periodically structured sawtooth profile, wherein the protrusions can be cubes or rectangles which have a sawtooth profile in one direction, and which are periodically arranged, like a checkerboard. The profile can be arranged to form a (blazed) two dimensional grating, with a certain number of periodically arranged structures, for example periodical sawtooth protrusions. A further embodiment of a periodically arranged profile in two directions is a structure with a periodically structured square wave profile, wherein the protrusions can be cubes or rectangles which are periodically arranged, like a checkerboard. The profile can be arranged to form a blazed two dimensional grating, with a certain number of periodically arranged cubes or rectangles, for example periodical square wave protrusions. When using such two dimensional profiles, the protrusions are arranged in a block structure of sawtooth protrusions, for example free standing periodical sawtooth protrusions, or block protrusions, for example free standing periodical square wave protrusions with cubes or rectangles, as described in U.S. Pat. No. 6,469,827 or in E. Hecht, "Optics", Second Edition, p. 430 (paragraph 10.2.7).

In an embodiment, the first and second protrusions may have a laminar sawtooth profile, wherein the protrusions have a sawtooth profile that is laminarly arranged on a mirroring surface and wherein the protrusions have a period of about 100 nm to 10 µm, i.e. a period of first and second protrusions, both forming the sawtooth profile, and wherein the height of the protrusions is about 5-500 nm. In a further embodiment, this height may be about 10-100 nm. The profile can be arranged to form a blazed one dimensional grating, with a certain number of parallel lines for example laminar sawtooth protrusions. The blaze angle, and thereby the height of the second protrusion, can be chosen such that at a certain angle of incidence, for example normal incidence, the optical path length is constant over the surface or changes only an amount of a multiple times the wavelength.

In yet another embodiment, the protrusions may also have a laminar square wave profile, wherein the protrusions have a square or rectangle structure, that is laminarly arranged on a mirroring surface, and the protrusions have a period of about 100 nm to 10 µm, i.e. a period of first and second protrusions, both forming the square wave profile, and the height of the protrusions is about 5-500 nm. In a further embodiment, this height may be about 10-100 nm. The height of the second protrusion can be chosen such that at a certain angle of incidence, for example normal incidence, the optical path length is constant over the surface or changes only an amount of a multiple times the wavelength. The profile can be arranged to form a one dimensional grating, with a certain number of parallel lines, for example laminar square wave protrusions.

"Transmissive" or "substantially transmissive" in this context means that the transmission through a protrusion is at least 70%, preferably at least 80%, at least 90% or at least 95%, more preferably 98%. "Not absorbed" or "substantially not absorbed" in this context means that the absorption of radiation is less than 30%, preferably less than 20%, less than 10% or less than 5%, more preferably less than 2%.

"Undesired radiation" or "undesired wavelength" refers to radiation having wavelengths larger or smaller than the wavelength that is intended to be used. For example, when EUV radiation with a wavelength of about 13.5 nm is desired, radiation with a wavelength smaller than about 10 nm or larger than about 20 nm is not desired. In a further embodiment, when EUV radiation with a wavelength of about 13.5 nm is desired, radiation with a wavelength smaller than about 13 nm or larger than about 14 nm is not desired, and thus wavelengths between 13 and 14 nm are desired wavelengths. The better the spectral separation, the better results and products can be obtained with a lithographic apparatus that includes a mirror according to the present invention. In the present invention, with "reflecting unwanted wavelengths" or "reflecting undesired wavelengths", or equivalents thereof is meant that radiation with unwanted or undesired wavelengths is reflected.

In the present invention, the use of "first" and "second" protrusion indicates the different protrusions of different materials. These terms do not imply a certain order. The phrase "passing one protrusion" or "passing exactly one protrusion" refers to the situation that substantially all radiation of the beam of radiation, especially the radiation with desired wavelengths, passes through one protrusion. However, due to some divergence of the beam, it cannot be excluded that some radiation does not pass only one protrusion. The same applies for the embodiment where radiation passes through one first and one second protrusion.

The phrase "selected from at least one of" may also be understood as including combinations of materials of such group.

The phrase "an angle of incidence between 0° and 90°" means an angle of incidence larger than 0° and smaller than 90°.

Although specific reference may be made in this text to the use of the apparatus according to the present invention in the manufacture of ICs, it should be appreciated that such an apparatus has many other possible applications. For example, it may be employed in the manufacture of integrated optical systems, guidance and detection patterns for magnetic domain memories, liquid-crystal display panels, thin-film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm or, when applicable, even shorter wavelengths), but especially radiation which has a wavelength less than 20 nm (EUV radiation), more preferably about 13.5 nm.

The term "patterning device" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). Examples of such patterning device include a mask. The concept of a mask is well known in lithography, and it includes mask types such as binary, alternating phase-shift, and attenuated phase-shift, as well as various hybrid mask types. Placement of such a mask in the radiation beam causes selective transmission, in the case of a transmissive mask, or reflection, in the case of a reflective mask, of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is programmable mirror array. One example of such a device is a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localised electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can include one or more programmable mirror arrays. More information on mirror arrays as here referred to can be found in U.S. Pat. Nos. 5,296,891 and 5,523,193, and PCT patent applications WO 98/38597 and WO 98/33096, which are incorporated herein by reference. In the case of a programmable mirror array, the support may be embodied as a frame or table, for example, which may be fixed or movable as required.

Another example of a patterning device is a programmable LCD array. An example of such a construction is given in U.S. Pat. No. 5,229,872, which is incorporated herein by reference. As above, the support may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper or step-and-repeat apparatus. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can found in U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. Nos. 5,969,441 and 6,262,796, both incorporated herein by reference.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
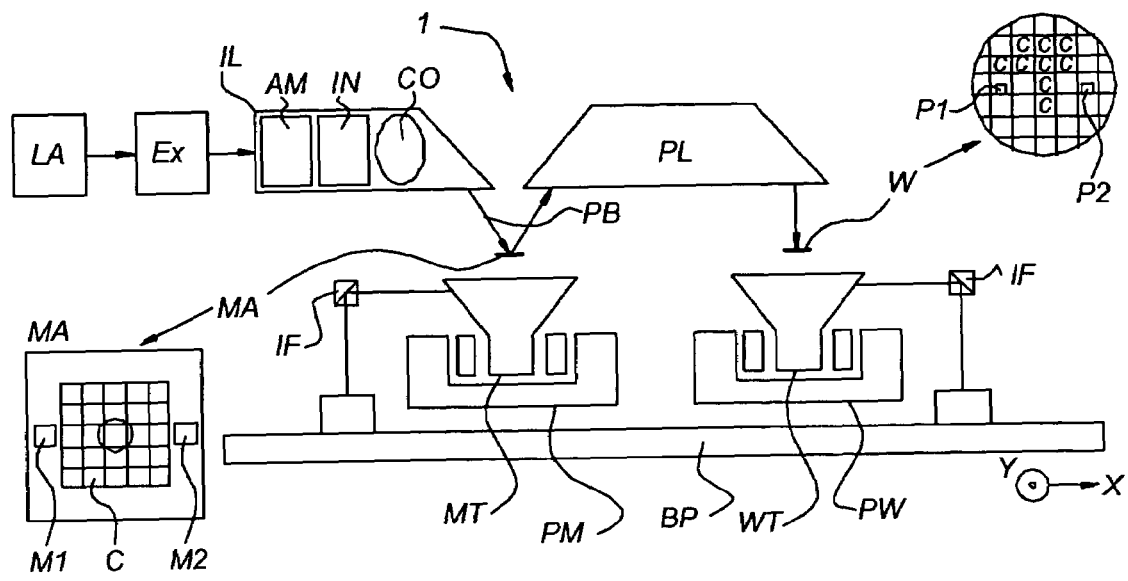
FIG. 1 schematically depicts a lithographic projection apparatus according to an embodiment of the present invention.

FIG. 1 schematically depicts a lithographic projection apparatus 1 according to an embodiment of the present invention. The apparatus includes a radiation system, which may include a radiation source LA, a beam expander Ex, and an illumination system IL configured to supply a beam of radiation PB, for example 157 nm radiation. A first object table (mask table) MT is provided with a mask holder to hold a mask MA (e.g. a reticle), and is connected to first positioning device PM that accurately positions the mask with respect to the projection system PL. A second object table (substrate table) WT is provided with a substrate holder to hold a PW that accurately positions the substrate with respect to the projection system PL. The projection system ("lens") PL (e.g. refractive, catadioptric or reflective optics) images an irradiated portion of the mask MA onto a target portion C (e.g. including one or more dies) of the substrate W.

As here depicted, the apparatus is of a reflective type. However, in general, it may also be of a transmissive type. Alternatively, the apparatus may employ another kind of patterning device, such as a programmable mirror array of a type as referred to above.

The source LA (e.g. an EUV excimer source or a plasma discharge source) produces radiation. This radiation is fed into the illumination system (illuminator) IL, either directly or after having traversed a conditioning device, for example the beam expander Ex. The illuminator IL may include an adjusting device AM to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus 1, but that it may also be remote from the lithographic projection apparatus 1. The radiation beam that it produces may be led into the apparatus 1 (e.g. with the aid of suitable directing mirrors). This latter scenario is often the case when the source LA is a laser. The present invention encompass both of these scenarios.

The beam PB subsequently intercepts the mask MA, which is held on a mask table MT. Having traversed the mask MA, the beam PB passes through the projection system PL, which focuses the beam PB onto a target portion C of the substrate W. With the aid of the second positioning device PW, and interferometric measuring device IF, the substrate table WT can be moved accurately to position different target portions C in the path of the beam PB. Similarly, the first positioning device PM, and interferometric measuring device IF, can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper, as opposed to a step-and-scan apparatus, the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected at once (i.e. a single "flash") onto a target portion C. The substrate table WT is then shifted in the X and/or Y directions so that a different target portion C can be irradiated by the beam PB; and 2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The radiation source LA, the illumination system IL and the projection system PL may be contained in respective compartments ("boxes") which are evacuated or flushed with a gas transparent to the radiation of the beam PB. The beam PB is passed between the different compartments through openings in their walls. An example of an arrangement for passing the beam PB from the radiation source LA to the illumination system IL to the projection system is shown in greater detail in FIG. 2.

Figure 2:
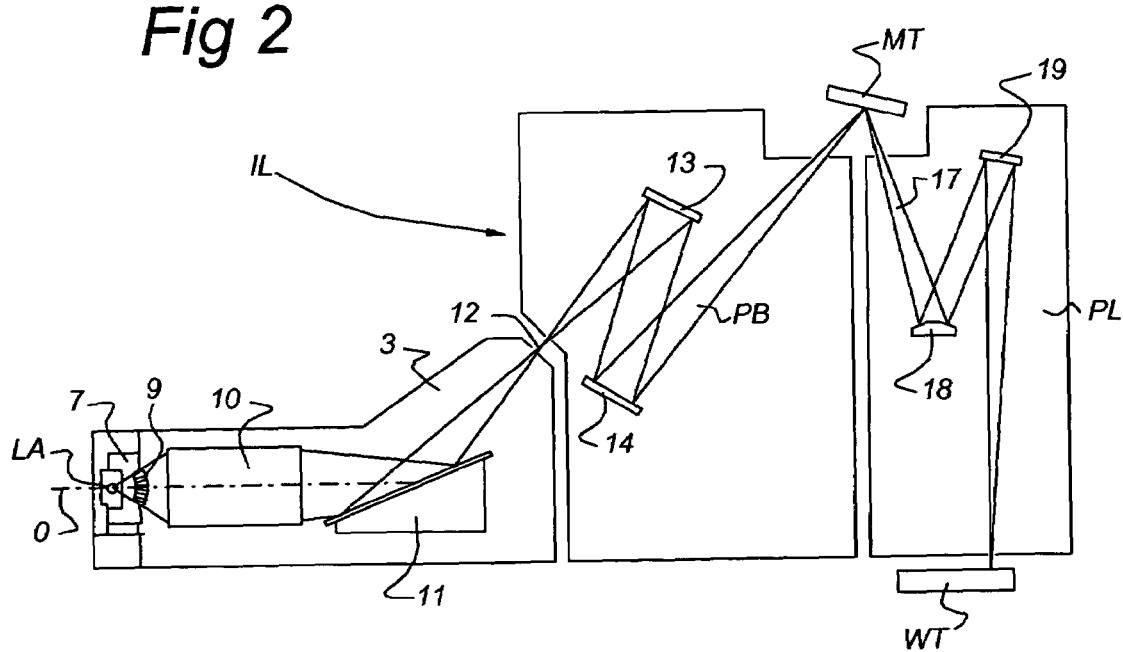
FIG. 2 schematically depicts a side view of an EUV illumination system and projection optics of a lithographic projection apparatus according to FIG. 1.

FIG. 2 shows an embodiment of the lithographic projection apparatus 1 of FIG. 1, including a radiation system 3 (i.e. "source-collector module"), the illumination system IL, and the projection system PL. The radiation system 3 is provided with the radiation source LA which may include a discharge plasma source. The radiation source LA may employ a gas or vapor, such as Xe gas or Li vapor in which a very hot plasma can be created by a discharge between electrodes of the radiation source to emit radiation in the EUV range of the electromagnetic spectrum. The very hot plasma is created by causing a partially ionised plasma of an electrical discharge to collapse onto an optical axis 0. Partial pressures of 0.1 mbar of Xe, Li vapor or any other suitable gas or vapor may be required for efficient generation of the radiation.

When xenon is used, the plasma may radiate in the EUV range around 13.5 nm. The radiation emitted by the radiation source LA may be led from a source chamber 7 to a contaminant barrier 9. The contaminant barrier 9 may include a channel structure such as, for instance, described in detail in U.S. Pat. No. 6,359,969.

The radiation system 3 includes a radiation collector 10 which may be formed by a grazing incidence collector. Radiation passed by the radiation collector 10 is reflected off a grating spectral filter or mirror 11 to be focused in a virtual source point 12 at an aperture. The beam PB is reflected in the illumination system IL via normal incidence reflectors 13, 14 onto the reticle or mask positioned on the reticle or mask table MT. A patterned beam 17 is formed which is imaged in the projection system PL via reflective elements 18, 19 onto wafer stage or substrate table WT. More elements than shown may generally be present in the illumination system IL and the projection system PL.

One or more of the mirrors of FIG. 2, for example the spectral filter or mirror 11, the radiation collector 10, or the normal incidence reflectors 13, 14, can be a mirror according to the present invention, and have a laminar protrusion profile, for example a one dimensional profile with protrusions on the mirror surface including a material selected from at least one of Be, B, C, P, S, K, Ca, Sc, Br, Rb, Sr, Y, Zr, Nb, Ba, La, Ce, Pr, Pa, U and Mo, as will be explained hereinafter.

Figure 3:
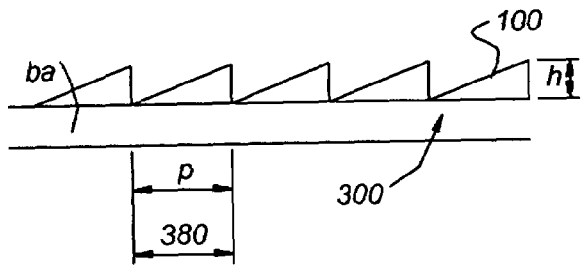
FIG. 3 schematically depicts a mirror with protrusions on the mirror surface in the form of a laminar sawtooth profile.
Figure 4:
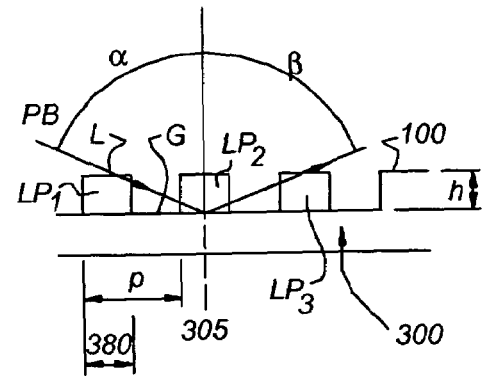
FIG. 4 schematically depicts a mirror with protrusions on the mirror surface in the form of a laminar square wave profile.

An embodiment of a mirror according to the present invention is shown in FIG. 3, wherein a laminar sawtooth profile is shown on a mirror surface 300 of the mirror, and wherein the protrusions 100 have a period p, a length 380, a height h, and an angle ba. FIG. 4 depicts another embodiment with a protrusion profile having a laminar square wave profile, wherein the protrusions have a period p, a length 380, and a height h. Reference L refers to "land" and reference G refers to "groove."

When the mirror, or an apparatus including the mirror, reflects EUV radiation under a certain angle, only the desired EUV radiation is reflected in this angle, whereas undesired radiation, for example IR radiation, is absorbed by above the mentioned materials and/or is deflected or refracted in other directions. Referring to FIG. 4, the beam PB, having an angle of incidence α, hits the surface of a laminar protrusion $LP_1$. Part of the beam (not shown) might be reflected and part of the beam, or all of the beam might enter the protrusion. Since the protrusion is transmissive for EUV radiation, the EUV radiation propagates unabsorbed or substantially unabsorbed, whereas radiation with undesired wavelengths like UV or IR is substantially absorbed. The beam may further propagate to the next laminar protrusion $LP_2$. Reaching the (left) surface of this protrusion LP2, part of the radiation (not shown) might again be reflected, and part of the radiation will propagate through the protrusion $LP_2$. Also this protrusion $LP_2$ will discriminate between EUV radiation and radiation with other wavelengths. When the beam PB reaches the mirror surface 300 (e.g. a multilayer mirror) at position 305, the beam PB is reflected with an angle β. The angle of reflection β may equal the angle of incidence α in case of specular reflection on the mirror surface 300. The beam PB may propagate further through protrusions $LP_2$ and $LP_3$. In this way, the beam PB will include a higher EUV/non-EUV radiation ratio after reflection by the mirror of the present invention than before the incidence on the mirror. What has been illustrated in FIG. 4 with respect to the propagation of the beam PB may also apply for FIG. 3, where instead of laminar protrusions forming a laminar square wave profile like in FIG. 4, a laminar sawtooth profile is used.

Note that refraction of the beam PB is not depicted in FIGS. 3 and 4 (and later FIGS. 5 and 9). The above-mentioned ratio may further be improved by using a blazed or optimised grating, as described below with respect to 6 and 7. The mirror with the above-mentioned protrusions can, even when it is optimised or blazed at for example UV wavelengths, block undesired wavelengths, for example IR, but transmit EUV radiation, since Be, B, C, P, S, K, Ca, Sc, Br, Rb, Sr, Y, Zr, Nb, Mo, Ba, La, Ce, Pr, Pa and U are substantially transmissive for EUV radiation, but substantially not transmissive for radiation having other wavelengths than EUV radiation. Additionally, all these materials, including Si, have an absorption length longer than 100 nm for 13.5 nm radiation. The protrusions can also include combinations of materials, for example $B_4C$ or SiC.

The protrusions on the mirror surface 300 are mainly present as an optical filter that is transmissive for EUV radiation, and a possible grating or diffractive structure, that is substantially transmissive for the EUV radiation of the beam PB. However, due to the difference in indices of refraction when the EUV radiation enters and leaves the protrusion, there may be some diffractive losses of the EUV radiation of the beam PB. This might be solved by other embodiments described below.

Figure 5:
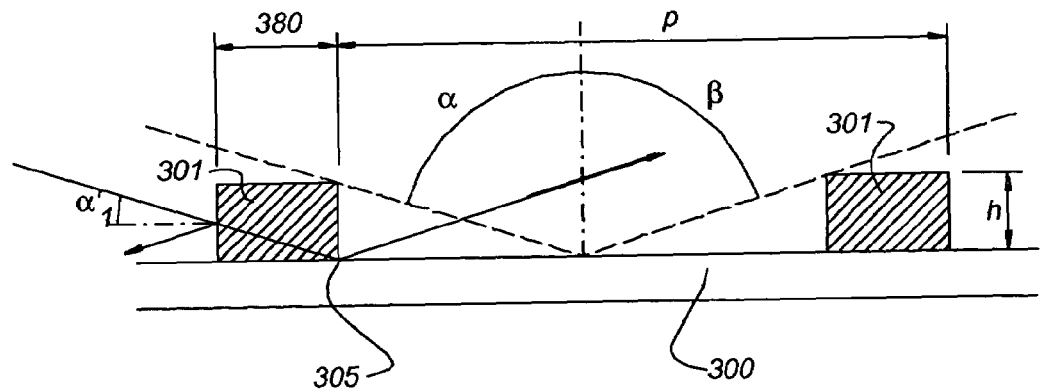
FIG. 5 schematically depicts a mirror wherein the protrusions are arranged in such a way that a part of EUV radiation of a beam of radiation, including EUV radiation, only passes one protrusion.

Referring to FIG. 5, the protrusions 301 are arranged in such a way that a part of EUV radiation of a beam including EUV radiation, having an angle of incidence between 0 and 90°, only passes one protrusion, or substantially every part of the beam PB passes only one protrusion.

The profile, which might be diffractive and designed at about 13.5 nm or other EUV wavelengths, is constructed such that the desired radiation included in radiation beam PB only passes one period p of the profile and is reflected at the mirroring surface 300 at position 305. The angle of incidence $α'_1$ of the beam PB with a side surface of a protrusion 301 may remain small to minimize reflection of the beam PB. Also, the upper surface of the protrusions of the profile can be angled, as in a blazed grating, so that the reflection of the undesired radiation, for example with wavelengths higher than EUV, such as UV VIS and IR, on the protrusion surface is directed in a different direction than the desired radiation. The length 380 and height h of the protrusions, the period p in which the protrusions are arranged, as well as the angle of incidence α, may be chosen such that the projection beam PB only passes one protrusion.

The profile on the mirror can be produced by ruling (scratching a line) with a diamond tool. It is also possible to produce the profile by ion etching of a sinusoidal structure. Producing a block profile on a grazing incidence-mirror using lithographic techniques, with subsequent ion etching is also an option. The profile as shown in FIG. 5 is given as an example. Other profiles are also possible, provided that EUV radiation is substantially not absorbed (i.e. is substantially transmissive), and diffraction of EUV radiation is small (e.g. less than about 30% is diffracted).

FIG. 5 shows by way of example a laminar square wave profile. However, this embodiment also includes the configuration wherein a laminar sawtooth profile is used, or wherein a periodically structured sawtooth profile or periodically structured square wave profile is used. In case a laminar sawtooth profile is used, the length 380 and height h of the protrusions, the period p in which the protrusions are arranged, and the angle ba, as well as the angle of incidence α may be chosen such that the projection beam PB only passes one protrusion.

Similarly this applies to the periodically structured profiles. However in such embodiment the period p includes two periods, since a two dimensional structure is formed. This embodiment may also include a profile wherein the protrusions have a length 380 that is smaller than half a period p. This is shown in FIG. 5 for the laminar square wave profile, but this may also apply for a sawtooth profile and for two dimensional profiles. The protrusions on the mirror of this embodiment are mainly present as an optical filter that is transmissive for EUV radiation.

Figure 6:
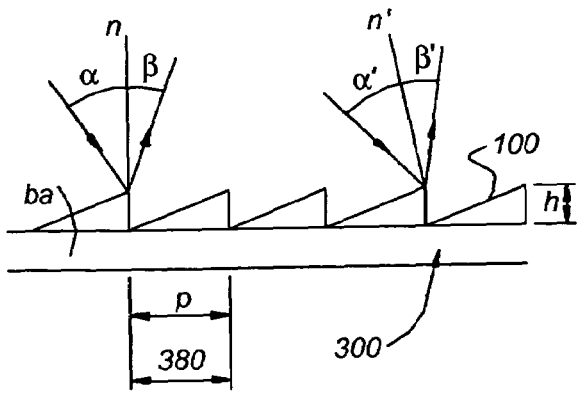
FIG. 6 schematically depicts the mirror as shown in FIG. 3 but with the protrusions arranged to form a diffractive grating for EUV radiation, having a laminar sawtooth profile (blazed grating)
Figure 7:
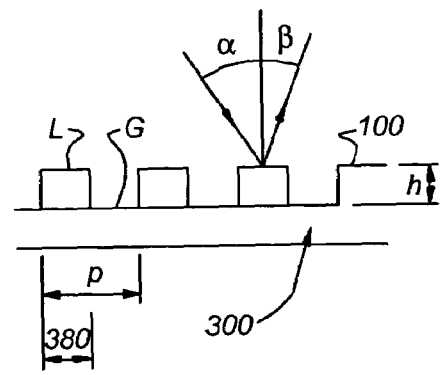
FIG. 7 schematically depicts the mirror as shown in FIG. 4, but with the protrusions arranged to form a diffractive grating for EUV radiation, having a laminar square wave profile.

Referring to FIGS. 6 and 7, the profile of protrusions forms a grating that may be designed or blazed at the desired radiation, e.g. 13.5 nm or another EUV wavelength. Alternatively, the grating may be designed or blazed at other wavelengths, e.g. wavelengths in the UV, VIS or IR.

In FIG. 6, a blazed grating has a sawtooth profile on mirror surface 300 with the grating constant p equal to the length 380 of a period of the sawtooth. The radiation beam PB may reach the surface of the protrusions 100 on the surface 300 at an angle of incidence α and may be reflected by this surface at an angle of reflection β. These angles are defined with respect to a normal n on the mirror surface 300. The blaze angle can be chosen in such a way that the $0^{th}$ order of the grating is minimal for undesired radiation. Furthermore, it can be chosen in such a way that the diffraction efficiency of the desired radiation is maximized. With such an arrangement, a diffraction efficiency of 100% is theoretically possible, as disclosed for example in U.S. Pat. No. 6,678,037, which is incorporated by reference. The height h and length 380 of the protrusions determine the efficiency of the 13.5 nm transmission: The grating constant p determines the wavelength range that is transmitted through the aperture 12 in FIG. 2.

Referring to FIG. 7, a laminar grating having a square wave surface profile with the grating constant p equal to one period p of the square wave and equal to twice the length 380 of a protrusion may be used. Such a grating may be made using lithographic techniques. In such a technique, the upper surface is polished to a very good surface roughness and grooves are etched with the lands L defined by a photoresist pattern.

To extract the undesired longer-wavelength radiation (longer than the wavelength of the desired EUV radiation), a diffraction grating structure as shown in FIG. 7 is applied to the mirror surface 300. The grating is arranged so that the optical path difference (OPD) between rays having been reflected by the land L and the groove G parts of the grating is an integer multiple of the wavelength of the desired radiation, i.e.

$$OPD = m.\lambda_{euv} \quad (1)$$

where m is an integer and $\lambda_{euv}$ is the wavelength of the desired radiation. At the same time, for the OPD for the other, undesired radiation, equation (1) generally does not hold. For example, for some wavelengths the OPD is an integer multiple plus half a wavelength in an undesired radiation range, i.e.

$$OPD = (m+\frac{1}{2}).\lambda_{ud} \quad (2)$$

where m is an integer and $\lambda_{ud}$ is the wavelength of the undesired radiation.

By satisfying equation (1), the grating does not disturb the desired radiation which is reflected as intended by mirror surface 300, effectively all desired or substantially all desired radiation is diffracted into the $0^{th}$ order beam, since the grating is transmissive for the desired radiation. See also FIGS. 4 and/or 5. However, the undesired radiation is diffracted as determined by the grating equation and for wavelengths for which equation (2) is exactly satisfied the diffraction efficiency is at a maximum with all energy diffracted out of the $0^{th}$ order beam, as described in U.S. Pat. No. 6,678,037. In this way, the undesired radiation is spatially separated from the desired radiation forming the beam PB and can be absorbed by a suitable heat sink or beam dump.

When a profile is selected having a grating structure, according to a further embodiment the profile of protrusions forms a grating having a sawtooth profile, that is designed for the deflection of undesired radiation. In another embodiment, when a profile is selected having a grating structure, the profile of protrusions forms a grating having a square wave profile, that is optimized at EUV wavelengths, for example 13.5 nm.

Figure 8:
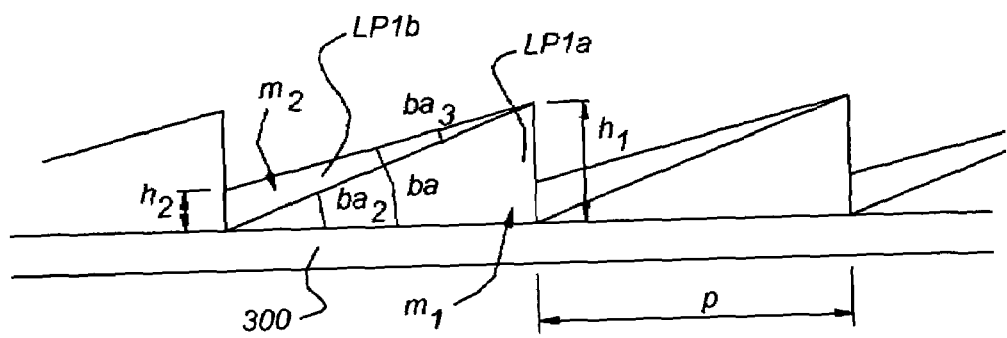
FIG. 8 schematically depicts a mirror protrusions with on the mirror surface in the form of a laminar sawtooth profile of two materials on top of each other.

In the embodiments described above, a lithographic apparatus was described in general, and mirrors including one or more protrusions including a material selected from at least one of Be, B, C, P, S, K, Ca, Sc, Br, Rb, Sr, Y, Zr, Nb, Mo, Ba, La, Ce, Pr, Pa and U were described. Referring to FIGS. 8 and 9, a mirror is described including at least two different protrusions including two or more different materials. The mirror includes a mirror surface 300 with different protrusions, e.g. a first protrusion and a second protrusion.

In this embodiment, the mirror surface 300 includes one or more first protrusions LP1a including a first material m1 selected from at least one of Be, B, C, P, S, K, Ca, Sc, Br, Rb, Sr, Y, Zr, Nb, Mo, Ba, La, Ce, Pr, Pa and U, and one or more second protrusions LP1b including a second material m2 selected from at least one of Be, B, C, Si, P, S, K, Ca, Sc, Br, Rb, Sr, Y, Zr, Nb, Mo, Ba, La, Ce, Pr, Pa and U, wherein the first and second materials are not the same, i.e. the first protrusion LP1a and the second protrusion LP1b include different materials or different material compositions, e.g. Si and Mo, Mo and Zr, C and Si, Be and Zr, etc. In another example, m1 is Be or Zr, and m2 is $Si_3N_4$ or $SiO_2$. When desired, more materials than m1 and m2, and/or more protrusions than the first and second protrusions can be applied on the mirror surface 300.

Referring to FIG. 8, a laminar sawtooth profile on mirror surface 300, in contrast to the sawtooth profiles shown in FIGS. 3 and 6, includes structures of two materials. The first protrusion LP1a has a height h1, is formed of a first material m1, with a blaze angle ba2. The second protrusion LP1b is formed of a second material m2 with a height h2 and with an angle ba3. These protrusions (of two or more materials) form together one protrusion or structure with a blaze angle ba. The protrusions may form a regular structure with period p. The protrusions on mirror surface 300, as shown in FIG. 8, may form a grating that may be blazed at EUV wavelengths, but they may also be blazed at other wavelengths, e.g. UV, VIS or IR wavelengths.

The blaze angle ba can be chosen in such a way that undesired radiation is deflected from the direction of the desired radiation, as above in FIG. 6. The blaze angle ba depends on angle ba2 of material m1 of the first protrusion LP1a, on angle ba3 of material m2 of the second protrusion LP1b, and on heights h1 and h2 of the first and second protrusions LP1a and LP1b, which are in this case on top of each other.

Figure 9:
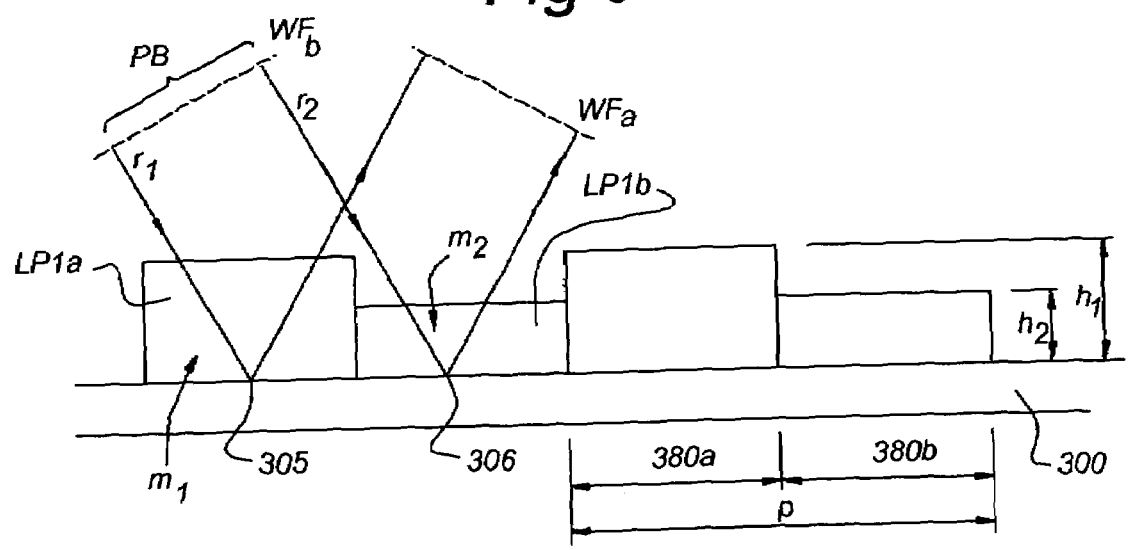
FIG. 9 schematically depicts a mirror with protrusions on the mirror surface in the form of a laminar square wave profile of two materials next to each other.

Referring to FIG. 9, the laminar profile may have a square wave surface profile with the constant p, equal to one period p of the laminar sawtooth profile shown in FIG. 8. The protrusions are located next to another in an alternating sequence and have different heights, e.g. the first protrusion LP1a of material m1 has height h1, and the second protrusion LP1b of material m2 has height h2. The lengths 380a and 380b of the protrusions LP1a and LP1b are the same and the length of both when added is equal to period p.

By selecting the materials based on their index of refraction, heights h1 and h2, and when applicable lengths 380a and 380b or the angles ba, ba2 and ba3, distance (period p) of the first and second protrusions, and a certain angle of incidence of the projection beam on the mirror, a mirror can be obtained that reflects at a certain angle the desired radiation while correcting by the different materials the optical path length difference, such that it does not vary over the mirror surface, whereas light of undesired wavelengths is absorbed and/or deflected at other angles.

Referring to FIG. 9, a ray r1 of beam PB enters a first protrusion LP1a of material m1 and may be substantially transmitted through this protrusion and reflected at the mirror surface 300 at position 305. After being reflected, ray r1 leaves the protrusion. Ray r2, also included in the beam PB, enters a second protrusion LP1b of material m2 and is reflected at position 306 on the mirroring surface 300. Without the presence of the second protrusion LP1b, the optical path length through the first and second protrusions and vacuum is different for different rays. To compensate for this difference in optical path length, the second protrusion LP1b of material m2 is present. This material m2 has a different index of refraction than the first material m1. By choosing the appropriate dimensions of the protrusions and an angle of incidence, as mentioned above, the second protrusion LP1b of material m2 can compensate for the optical path difference for the different rays in the beam PB, thereby providing an optical path length difference that does not vary over the mirror surface. This means that the optical path length difference is zero or an integer times the wavelength. The vacuum above the protrusions should also be taken into account for the determination of the optical path length difference. In this way, the optical path lengths, i.e. pathlength times the indices of refraction are for rays r1 and r2, starting from wave front $WF_b$, before entering protrusions LP1a and LP1b, to wave front $WF_a$, after the protrusions LP1a and LP1b, are the same or the difference between the optical path lengths for rays r1 and r2 is an integer times the wavelength. Hence, in this embodiment an optical path length difference is created for EUV radiation that does not vary over the mirror surface.

For Si, having an index of refraction that is near unity for EUV radiation, the presence of such compensating second protrusions might be less necessary. However, when applying one of the other materials, the presence of the second protrusion LP1b might be desirable. Nevertheless, Si may also create a small optical pathlength difference between the different rays, like that shown for rays r1 and r2 in FIG. 9, within a beam PB, that might be compensated by the presence of second protrusions LP1b of Be, B, C, P, S, K, Ca, Sc, Br, Rb, Sr, Y, Zr, Nb, Mo, Ba, La, Ce, Pr, Pa and U.

This embodiment also includes a mirror having a mirror surface, for example in a lithographic apparatus, wherein the protrusions are arranged in such a way that a part of EUV radiation of a beam including EUV radiation, having an angle of incidence between 0 and 90°, only passes, in one period p, one first protrusion LP1a of material m1 and one second protrusion LP1b of material m2, similar to FIG. 5. This means that the length of the protrusions 380a and 380b is smaller than the period p, as for example in FIG. 5, wherein the length 1 of the protrusion is smaller than half a period p (groove G and land L form one period in FIG. 5).

This embodiment also includes a mirror wherein the profile of protrusions forms a grating that is blazed (sawtooth) or optimized (square wave) at the desired radiation. Profiles of these types on mirrors may have a one dimensional or two dimensional character. Since these protrusions are transparent to EUV radiation, the desired wavelengths are reflected by the mirror surface 300, and the undesired wavelengths of the radiation are absorbed, refracted and/or deflected.

In general this embodiment includes a mirror having a mirror surface 300, wherein the mirror surface 300 includes a first protrusion LP1a including a first material m1 and a second protrusion LP1b including a second material m2, wherein the first and second materials are not the same. Such a mirror 300 can be used as an optical filter, when the materials that are used are transparent for the desired wavelength, or optimized to be transparent for the desired wavelengths. Other, undesired wavelengths may be absorbed by the materials, and when a grating for a certain wavelength is chosen (grating or blazed grating), the undesired wavelengths might also be at least partially deflected.

Referring to FIG. 8, the mirror surface 300 includes a first protrusion LP1a including a first material m1 selected from at least one of Be, B, C, P, S, K, Ca, Sc, Br, Rb, Sr, Y, Zr, Nb, Mo, Ba, La, Ce, Pr, Pa and U, and a second protrusion LP1b including a second material m2 selected from at least one of Be, B, C, Si, P, S, K, Ca, Sc, Br, Rb, Sr, Y, Zr, Nb, Mo, Ba, La, Ce, Pr, Pa and U, wherein the first and second materials m1 and m2 are not the same, the protrusions LP1a and LP1b include different materials (m1 and m2), the protrusions LP1a and LP1b have a sawtooth profile, and the first protrusion LP1a and the second LP1b protrusion are arranged such that they form together one protrusion with a certain period p. Hence, within the period p (along the mirror surface 300), there is a difference in materials, for example a gradient. This can be seen in FIG. 8, wherein on the left side (at h2) of the protrusion formed by the first and second protrusions LP1a and LP1b, this protrusion includes relatively more of material m2, whereas at the right side of the protrusion (at h1), this protrusion includes relatively more of material m1.

Referring to FIG. 9, the mirror surface 300 includes a first protrusion LP1a including a first material m1 selected from at least one of Be, B, C, P, S, K, Ca, Sc, Br, Rb, Sr, Y, Zr, Nb, Mo, Ba, La, Ce, Pr, Pa and U, and a second protrusion LP1b including a second material m2 selected from at least one of Be, B, C, Si, P, S, K, Ca, Sc, Br, Rb, Sr, Y, Zr, Nb, Mo, Ba, La, Ce, Pr, Pa and U, wherein the first and second materials m1 and m2 of the first and second protrusions LP1a and LP1b are not the same, the protrusions LP1a and LP1b include different materials m1 and m2, the protrusions LP1a and LP1b have a square wave profile, the first and second protrusions LP1a and LP1b are arranged next to each other, and form together two different protrusions LP1a and LP1b with a certain period p (380a and 380b). Hence, within the period p along the mirror surface 300, there is a difference in materials, for example a gradient. This can be seen in FIG. 9, wherein the first protrusion LP1a with height h1 and length 380a includes material m1, and the second protrusion LP1b with height h2 and length 380b includes material m2, thereby forming a gradient along period p with relatively more of material m1 at one side of the period and more of material m2 at the other side of the period along mirror 300.

Referring to both FIGS. 8 and 9, under a certain angle of the beam PB, at every position the sum of the phase shifts which are induced by the different materials is the same, or substantially the same, for the radiation that has to be transmitted. Hence, the first and second protrusions LP1a and LP1b are arranged in such a way that for EUV radiation an optical path length difference is created that does not vary over the mirror surface.

This embodiment also includes a lithographic apparatus including the mirror as described.

For providing the above described structures, the blazed structure may be provided by ruling a layer of material m1 with a diamond tool, depositing material m2, and ruling with a diamond tool for a second time. For the square shaped structures, a lithographic process may be used.

Further variations of the mirrors described above will now be described.

The mirror surface 300 may be provided with a cooling element which is in thermal contact with the mirror, for example as shown in FIG. 2 of U.S. Pat. No. 6,678,037. Cooling channels can be provided on the rear surface of the mirror, or incorporated in the body of the mirror. A suitable coolant fluid is passed through the cooling channels to maintain the mirror at a desired temperature.

The mirror surface 300 may be a multilayer mirror having protrusions of different materials, as described above.

The mirror surface 300 may be similar to that described in relation to FIG. 5, but the length 380 of the protrusions 301 may be substantially less than the period p of the protrusions. In this way, possible diffractive losses of the desired radiation at the top surfaces of the protrusions is minimized. For example, the ratio of the length 380 to the period p is equal or smaller than 1:5. For example the length 380 of the protrusion is 150 nm and the period p is 1250 nm. In a further variation, the beam passes exactly only one protrusion. The materials of the protrusions 301 in FIG. 5 can be selected from Be, B, C, Si, P, S, K, Ca, Sc, Br, Rb, Sr, Y, Zr, Nb, Mo, Ba, La, Ce, Pr, Pa and U. For example, B, C, Mo, Nb or Si can be chosen, but also $Si_3N_4$. Also combinations of materials can be chosen, e.g. $B_4C$ or SiC.

The mirror surface 300 may be a grazing incidence reflector. The angle of incidence with respect to the mirror surface may be approximately 75 to 85°. See, for example, the angle of incidence a in FIG. 6. The protrusions, either as single protrusions, or as first and second protrusions, are present on the radiation collector 10. See FIG. 2. In general, for an optical filter according to the invention it is desirable to have the mirror with the protrusions before the beam is focused, as it is in the virtual source point 12.

The protrusions, either as single protrusions or as first and second protrusions, may be present on the grating spectral filter or mirror 11 and/or the normal incidence mirrors 13 and/or 14 of FIG. 2.

The radiation that is used, for example in the beam PB of a lithographic apparatus, includes extreme ultraviolet radiation, e.g. having a wavelength in the range of from 8 to 20 nm, especially 9 to 16 nm, e.g. 13.5 nm.

Referring to FIG. 8, the mirror surface 300, the protrusions LP1a and LP1b may have a period p of about 100 nm to 10μm (period of first and second protrusion, both forming the sawtooth profile), and the height h1 of the protrusions may be about 10-500 nm (first protrusion LP1a), for example about 10-100 nm. The blaze angle, and thereby the height of the second protrusion, may be chosen such that at a certain angle of incidence, for example normal incidence, the optical path length is constant over the surface (or changes only an amount of a multiple times the wavelength). In other words, for example: $h2*n2+(h1-h2)*1=h1*n1$. Assuming an index of refraction n1 or material m1 is 0.96 (Zr), index of refraction n2 or material m2 is 0.92 (Mo) and height h1 is 100, height h2 may be 50 nm. Heights, periods and materials may be chosen depending upon the angle of incidence to be applied.

Referring to FIG. 9, the protrusions LP1a and LP1b may have a laminar square wave profile, wherein the protrusions have a square or rectangle structure, that is laminarly arranged on the mirror surface 300, the protrusions LP1a and LP1b have a period p of about 100 nm to 10 μm (period of first and second protrusion LP1a and LP1b, both forming the square wave profile), and the height (h1) of the protrusions is about 10-500 nm (first protrusion LP1a). In a further variation, this height hi may be about 10-100 nm. The height h2 of the second protrusion LP1a may be chosen such that at a certain angle of incidence, for example normal incidence, the optical path length is constant over the surface (or changes only an amount of a multiple times the wavelength). Height h2 may be 50 nm.

The materials may be selected from at least one of Si, Be and Zr, but different for the first and second protrusions.

The material of the first protrusion LP1a or the material of the second protrusion LP1a may include a material selected from at least one of Si, Be and Zr.

The materials m1 and m2 of the first and second protrusions LP1a and LP1b may have a relatively large difference in refractive index, for example Mo and Si. The protrusion LP1a may be Mo and protrusion LP1b may be Si, or vice versa.

While specific embodiments of the present invention have been described above, it will be appreciated that the present invention may be practised otherwise than as described. The description of the embodiments and the figures are not intended to limit the present invention.

What is claimed is:

1. A mirror, comprising:
a mirror surface;
a first protrusion on the mirror surface, the first protrusion comprising a first material; and
a second protrusion on the mirror surface, the second protrusion comprising a second material, wherein the first and second materials are not the same, and
wherein the first protrusion and the second protrusion are configured such that an optical path length difference between two rays of a beam of radiation that propagates through the first and second protrusions and reflected by the mirror surface is substantially zero or an integer times a wavelength of the beam of radiation over the mirror surface.

2. A mirror according to claim 1, wherein the first material is selected from at least one of Be, B, C, P, S, K, Ca, Sc, Br, Rb, Sr, Y, Zr, Nb, Mo, Ba, La, Ce, Pr, Pa and U, and comprising a second material selected from at least one of Be, B, C, Si, P, S, K, Ca, Sc, Br, Rb, Sr, Y, Zr, Nb, Mo, Ba, La, Ce, Pr, Pa and U.

3. A mirror according to claim 1, wherein the beam of radiation comprises EUV radiation.

4. A mirror according to claim 1, wherein the mirror is a grazing incidence mirror or a multilayer mirror.

5. A mirror according to claim 1, wherein the first protrusion and the second protrusion are configured such that when the beam of radiation is incident on the mirror, desired wavelengths of the beam of radiation are passed in a predetermined direction and undesired wavelengths of the beam of radiation are at least one of deflected in other directions or absorbed.

6. A mirror according to claim 1, wherein the first protrusion and the second protrusion are configured to form a blazed grating.

7. A lithographic projection apparatus, comprising:
a radiation system configured to supply a beam of radiation;

a support configured to support a patterning device, the patterning device configured to pattern the beam according to a desired pattern;

a substrate table configured to hold a substrate;

a projection system configured to project the patterned beam of radiation onto a target portion of the substrate; and a mirror within a path of the beam of radiation, the mirror comprising:

a mirror surface;

a first protrusion on the mirror surface, the first protrusion comprising a first material; and a second protrusion on the mirror surface, the second protrusion comprising a second material, wherein the first and second materials are not the same, wherein the first protrusion and the second protrusion are configured such that an optical path length difference between two rays of the beam of radiation that propagates through the first and second protrusions and reflected by the mirror surface is substantially zero or an integer times a wavelength of the beam of radiation over the mirror surface.

8. A lithographic apparatus according to claim 7, wherein the beam of radiation comprises EUV radiation.

9. A lithographic apparatus according to claim 7, wherein the mirror is close to the radiation system.

10. A device manufacturing method, comprising:

projecting a patterned beam of radiation onto a target portion of the layer of radiation-sensitive material; and reflecting the beam of radiation by use of a mirror, the mirror comprising a mirror surface, a first protrusion on the mirror surface, the first protrusion comprising a first material, and a second protrusion on the mirror surface, the second protrusion comprising a second material, wherein the first and second materials are not the same;

wherein the first and second protrusions are configured such that an optical path length difference between two rays of the radiation beam that propagates through the first and second protrusions and reflected by the mirror surface, is substantially zero or an integer times a wavelength of the beam of radiation over the mirror surface.

11. A method according to claim 10, wherein the radiation comprises EUV radiation.

12. A mirror according to claim 1, wherein the second material is substantially absent from the first protrusion.

13. A mirror according to claim 1, wherein the first protrusion has a first height and the second protrusion has a second height, and wherein the optical path length difference is created for the beam of radiation that does not vary over the mirror surface.

14. An optical element, comprising:

a first protrusion comprising a first material; and a second protrusion comprising a second material, the first material being substantially absent from the second protrusion, wherein the first protrusion and the second protrusion are configured such that an optical path length difference for a beam of radiation propagating through the first and second protrusions and reflected by a surface of the optical element is an integer times the wavelength of the beam of radiation.

15. An optical element according to claim 14, wherein the first protrusion has a height that is different than the height of the second protrusion.

* * * * *